(12) United States Patent
Anikitchev

(10) Patent No.: US 9,343,307 B2
(45) Date of Patent: May 17, 2016

(54) LASER SPIKE ANNEALING USING FIBER LASERS

(71) Applicant: Ultratech, Inc., San Jose, CA (US)

(72) Inventor: Serguei Anikitchev, Hayward, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 14/497,006

(22) Filed: Sep. 25, 2014

(65) Prior Publication Data

US 2015/0179449 A1    Jun. 25, 2015

Related U.S. Application Data

(60) Provisional application No. 61/920,655, filed on Dec. 24, 2013.

(51) Int. Cl.
*H01L 21/02* (2006.01)
*H01L 21/324* (2006.01)
(Continued)

(52) U.S. Cl.
CPC ...... *H01L 21/02683* (2013.01); *B23K 26/0608* (2013.01); *B23K 26/0736* (2013.01); *H01L 21/268* (2013.01); *H01L 21/324* (2013.01); *H01L 21/02532* (2013.01)

(58) Field of Classification Search
CPC ....... H01L 21/02; H01L 21/477; H01L 21/00; H01L 21/02683; H01L 21/02694; H01L 21/20; H01L 21/324; H01L 21/268; H01L 21/2026
USPC ............. 438/7, 795, 308, 166, 487, 378, 463, 438/535
See application file for complete search history.

(56) References Cited

U.S. PATENT DOCUMENTS

| | | | |
|---|---|---|---|
| 4,234,356 A | 11/1980 | Auston et al. | |
| 4,375,993 A | 3/1983 | Mori et al. | |

(Continued)

FOREIGN PATENT DOCUMENTS

| | | |
|---|---|---|
| JP | 2008-147428 A | 6/2008 |
| JP | 2010-087041 A | 4/2010 |

(Continued)

OTHER PUBLICATIONS

Office Action for counterpart Taiwan patent application No. 103141085 from the Taiwan Patent Office, dated Nov. 9, 2015.

(Continued)

*Primary Examiner* — Chuong A Luu
(74) *Attorney, Agent, or Firm* — Opticus IP Law PLLC

(57) ABSTRACT

The disclosure is directed to laser spike annealing using fiber lasers. The method includes performing laser spike annealing of a surface of a wafer by: generating with a plurality of fiber laser systems respective CW output radiation beams that partially overlap at the wafer surface to form an elongate annealing image having a long axis and a length $L_A$ along the long axis; heating at least a region of the wafer to a pre-anneal temperature $T_{PA}$; and scanning the elongate annealing image over the wafer surface and within the pre-heat region so that the annealing image has a dwell time $t_D$ in the range 30 ns ≤ $t_D$ ≤ 10 ms and raises the wafer surface temperature to an annealing temperature $T_A$.

14 Claims, 9 Drawing Sheets

(51) Int. Cl.
*H01L 21/268* (2006.01)
*B23K 26/06* (2014.01)
*B23K 26/073* (2006.01)

(56) References Cited

U.S. PATENT DOCUMENTS

| | | | |
|---|---|---|---|
| 5,357,365 | A | 10/1994 | Ipposhi et al. |
| 5,401,666 | A | 3/1995 | Tsukamoto |
| 5,612,251 | A | 3/1997 | Lee |
| 5,767,003 | A | 6/1998 | Noguchi |
| 5,803,965 | A | 9/1998 | Yoon |
| 5,908,307 | A | 6/1999 | Talwar et al. |
| 5,930,617 | A | 7/1999 | Wu |
| 5,959,779 | A | 9/1999 | Yamazaki et al. |
| 6,066,516 | A | 5/2000 | Miyasaka |
| 6,281,057 | B2 | 8/2001 | Aya et al. |
| 6,303,476 | B1 | 10/2001 | Hawryluk et al. |
| 6,335,509 | B1 | 1/2002 | Jung |
| 6,365,476 | B1 | 4/2002 | Talwar et al. |
| 6,366,308 | B1 | 4/2002 | Hawryluk et al. |
| 6,368,947 | B1 | 4/2002 | Yu |
| 6,383,956 | B2 | 5/2002 | Hawryluk et al. |
| 6,479,821 | B1 | 11/2002 | Hawryluk et al. |
| 6,514,339 | B1 | 2/2003 | Jung |
| 6,521,501 | B1 | 2/2003 | Erhardt et al. |
| 6,524,977 | B1 | 2/2003 | Yamazaki et al. |
| 6,531,681 | B1 | 3/2003 | Markle et al. |
| 6,548,361 | B1 | 4/2003 | En et al. |
| 6,558,991 | B2 | 5/2003 | Yamazaki et al. |
| 6,632,749 | B2 | 10/2003 | Miyasaka et al. |
| 6,693,257 | B1 | 2/2004 | Tanaka |
| 6,730,550 | B1 | 5/2004 | Yamazaki et al. |
| 6,747,245 | B2 | 6/2004 | Talwar et al. |
| 6,881,686 | B1 | 4/2005 | Sposili et al. |
| 6,897,889 | B2 | 5/2005 | Tanaka |
| 6,974,731 | B2 | 12/2005 | Yamazaki et al. |
| 6,987,240 | B2 | 1/2006 | Jennings et al. |
| 7,005,601 | B2 | 2/2006 | Jennings |
| 7,015,422 | B2 | 3/2006 | Timans |
| 7,098,155 | B2 | 8/2006 | Talwar et al. |
| 7,148,159 | B2 | 12/2006 | Talwar et al. |
| 7,279,721 | B2 | 10/2007 | Jennings et al. |
| 7,482,254 | B2 | 1/2009 | Bakeman |
| 7,494,942 | B2 | 2/2009 | Talwar et al. |
| 7,519,252 | B2 | 4/2009 | Morita |
| 7,595,208 | B2 | 9/2009 | Jennings et al. |
| 7,674,663 | B2 | 3/2010 | Yamazaki et al. |
| 7,731,798 | B2 | 6/2010 | Shareef et al. |
| 7,919,726 | B2 | 4/2011 | Tanaka |
| 8,026,519 | B1 | 9/2011 | Anikitchev et al. |
| 8,217,304 | B2 | 7/2012 | Cordingley et al. |
| 8,372,667 | B2 | 2/2013 | Moffatt |
| 8,399,808 | B2 | 3/2013 | Anikitchev et al. |
| 8,461,475 | B2 | 6/2013 | Krink et al. |
| 8,546,805 | B2 | 10/2013 | Shen et al. |
| 8,652,974 | B2 | 2/2014 | Piwczyk |
| 8,662,761 | B2 | 3/2014 | Yahata et al. |
| 2002/0048864 | A1 | 4/2002 | Yamazaki et al. |
| 2003/0089691 | A1 | 5/2003 | Tanaka |
| 2003/0226834 | A1 | 12/2003 | Ishikawa et al. |
| 2004/0040938 | A1 | 3/2004 | Yamazaki et al. |
| 2004/0069751 | A1 | 4/2004 | Yamazaki et al. |
| 2004/0097103 | A1 | 5/2004 | Imai et al. |
| 2004/0188399 | A1 | 9/2004 | Smart et al. |
| 2004/0198028 | A1 | 10/2004 | Tanaka et al. |
| 2004/0253838 | A1 | 12/2004 | Yamazaki et al. |
| 2005/0067384 | A1* | 3/2005 | Talwar .............. B23K 26/0604 219/121.6 |
| 2006/0163223 | A1 | 7/2006 | Zhang et al. |
| 2006/0234458 | A1 | 10/2006 | Jennings et al. |
| 2006/0237404 | A1 | 10/2006 | Ishikkawa et al. |
| 2007/0158315 | A1 | 7/2007 | Tanaka et al. |
| 2008/0008460 | A1 | 1/2008 | Timans |
| 2008/0045040 | A1 | 2/2008 | Nakao |
| 2009/0034071 | A1 | 2/2009 | Jennings et al. |
| 2009/0311880 | A1 | 12/2009 | Jennings et al. |
| 2010/0084744 | A1 | 4/2010 | Zafiropoulo et al. |
| 2010/0116801 | A1 | 5/2010 | Mukai et al. |
| 2010/0264123 | A1 | 10/2010 | Jennings et al. |
| 2011/0298093 | A1 | 12/2011 | Zafiropoulo et al. |
| 2013/0128905 | A1 | 5/2013 | Moffatt |
| 2014/0199858 | A1* | 7/2014 | Hoult ................... H01L 21/268 438/795 |

FOREIGN PATENT DOCUMENTS

| | | |
|---|---|---|
| JP | 2012-094698 | 5/2012 |
| JP | 2013-089930 A | 5/2013 |

OTHER PUBLICATIONS

Search Report for counterpart Singapore patent application No. 10201406938S from the Intellectual Property Office of Singapore, dated Jan. 14, 2015.

Written Opinion for counterpart Singapore patent application No. 10201406938S from the Intellectual Property Office of Singapore, dated Aug. 28, 2015.

Office Action for counterpart Japanese patent application No. 2014-215833 from the Japanese Patent Office, dated Feb. 29, 2016.

* cited by examiner

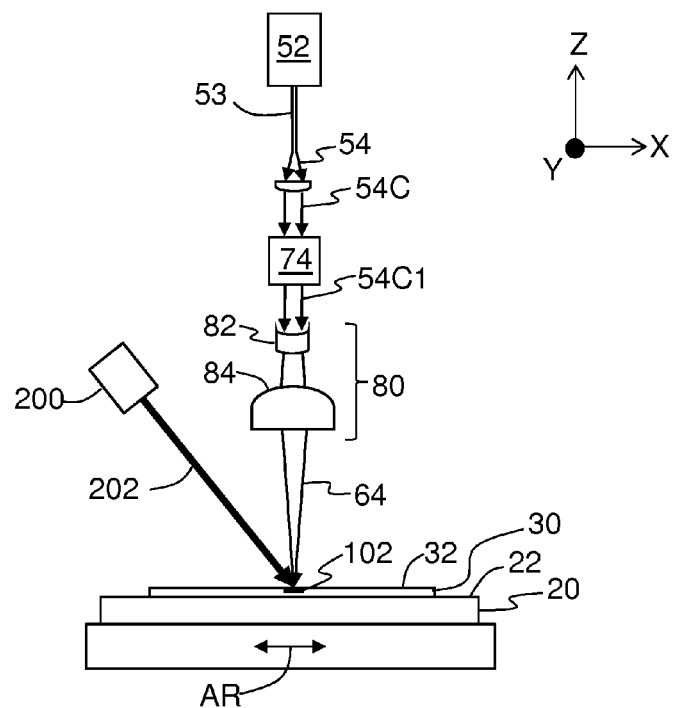
FIG. 8A
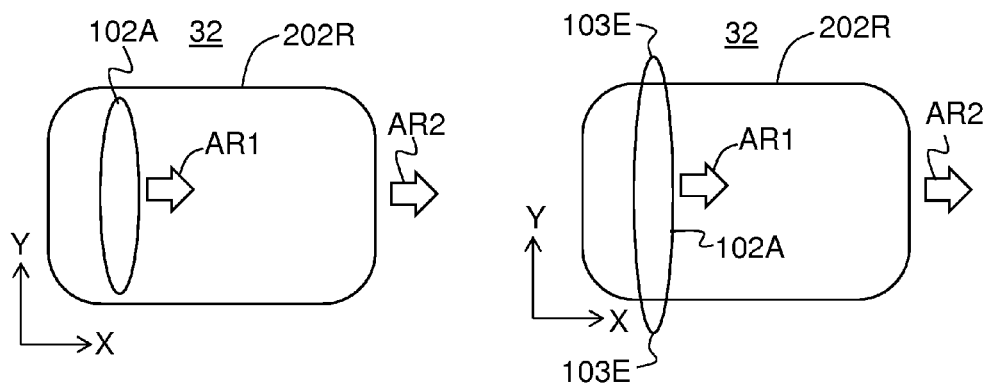
FIG. 8B  FIG. 8C

LASER SPIKE ANNEALING USING FIBER LASERS

CROSS-REFERENCE TO RELATED APPLICATIONS

This application claims the benefit of priority under 35 U.S.C. §119(e) of U.S. Provisional Application Ser. No. 61/920,655, filed on Dec. 24, 2013, and which is incorporated by reference herein.

FIELD

The present disclosure relates to laser spike annealing, and in particular relates to laser spike annealing using fiber lasers.

The entire disclosure of any publication or patent document mentioned herein is incorporated by reference.

BACKGROUND

Laser annealing using a scanned laser beam offers an ultra-low thermal budget, a high dopant activation and super-abrupt junctions that are ideal for advanced semiconductor device fabrication. Consequently, most logic devices with minimum feature sizes below 45 nm, and many memory devices below 32 nm, now use some form of laser processing for one of several manufacturing steps, including source-drain activation, metal-silicon alloy formation, defect annealing, and the like.

One form of laser annealing uses pulsed lasers. Examples of pulsed laser annealing are described in WO 2001/071787 A1, U.S. Pat. No. 6,365,476 and U.S. Pat. No. 6,366,308. Typical semiconductor applications require an annealing time of 0.1 milliseconds to 10 milliseconds (ms). Since optical pulses from a pulsed laser have a much shorter time duration (e.g., nanoseconds to microseconds) than the required annealing time, many optical pulses are required for a given exposure. This leads to problems in annealing uniformity because of pulse-to-pulse power variations.

SUMMARY

An aspect of the disclosure is a method of performing laser spike annealing of a surface of a wafer. The method includes: generating with a plurality of fiber laser systems respective continuous-wave (CW) output radiation beams that partially overlap at the wafer surface to form an elongate annealing image having a long axis and an annealing length $L_A$ along the long axis; heating at least a region of the wafer to a pre-anneal temperature $T_{PA}$ to define a pre-heat region; and scanning the elongate annealing image over the wafer surface and at least partially within (and in an example, entirely within) the pre-heat region in a direction substantially perpendicular to the long axis so that the annealing image has a dwell time $t_D$ in the range 100 ns$\leq t_D \leq$10 ms, or in another example 30 ns$\leq t_D \leq$10 ms, and raises the wafer surface temperature to an annealing temperature $T_A$.

Another aspect of the disclosure is the method described above, wherein the annealing length $L_A$ is in the range 3 mm$\leq L_A \leq$450 mm, or in another example 3 mm$\leq L_A \leq$30 mm.

Another aspect of the disclosure is the method described above, wherein the annealing image has width $W_A$ measured perpendicular to length $L_A$, and wherein 25 microns$\leq W_A \leq$500 microns, or in another example 50 microns$\leq W_A \leq$500 microns.

Another aspect of the disclosure is the method described above, wherein the annealing beam has an amount of optical power $P_A$ in the range 100 W$\leq P_A \leq$10,000 W, or in another example 100 W$\leq P_A \leq$1000 W, Another aspect of the disclosure is the method described above, wherein the pre-anneal temperature $T_{PA}$ is in the range 200° C.$\leq T_{PA} \leq$600° C.

Another aspect of the disclosure is the method described above, wherein the anneal temperature $T_A$ is either in the range 1100° C.$\leq T_A \leq$1350° C. or in the range $T_A \geq$1410° C.

Another aspect of the disclosure is the method described above, and further including: measuring a temperature distribution at the wafer surface; and adjusting an amount of power in at least one of the CW output radiation beams to improve an amount of uniformity in the temperature distribution.

Another aspect of the disclosure is the method described above, wherein the wafer has an edge, the annealing image has an end, and further comprising either reducing an amount of power in or turning off the CW output radiation beam that forms the end of the annealing image prior to the annealing image passing over the wafer edge.

Another aspect of the disclosure is the method described above, wherein the annealing image is formed by between three and (up to) 50 CW output radiation beams (i.e., 3, 4, 5, 6, etc., up to 50 output radiation beams).

Another aspect of the disclosure is the method described above, wherein the CW output radiation beams define elongate images of length L that partially overlap along the long axis by an amount $\Delta$, and wherein the amount of overlap $\Delta \geq 0.79 \cdot (L/2)$.

Another aspect of the disclosure is the method described above, and further including: sequentially irradiating a measurement wafer with the elongate radiation beams; detecting an amount of optical power reflected from the measurement wafer for each of the elongate radiation beams; and adjusting an amount of optical power in one or more of the elongate radiation beams to improve uniformity of the annealing image.

Another aspect of the disclosure is a system for performing laser spike annealing of a wafer having a surface. The system includes a plurality of fiber laser systems that deliver respective output radiation beams that partially overlap at the wafer surface to form an annealing image; a wafer support assembly that supports the wafer and heats the wafer to a pre-anneal temperature $T_{PA}$ and that moves the wafer relative to the annealing image so that the annealing image scans over the wafer surface with a dwell time $t_D$ in the range 100 ns$\leq t_D \leq$10 ms, or in another example 30 ns$\leq t_D \leq$10 ms; and wherein the annealing image has an amount of optical power $P_A$ in the range 10 W$\leq P_A \leq$1000 W, or in another example 10 W$\leq P_A \leq$100, so that the wafer surface temperature is raised from a pre-anneal temperature $T_{PA}$ to an annealing temperature $T_A$ during said scanning.

Another aspect of the disclosure is the system described above, wherein the pre-anneal temperature $T_{PA}$ is in the range 200° C.$\leq T_{PA} \leq$600° C.

Another aspect of the disclosure is the system described above, wherein the annealing temperature $T_A$ is either in the range 1100° C.$\leq T_A \leq$1350° C. or in the range $T_A \geq$1410° C.

Another aspect of the disclosure is a system for performing laser spike annealing of a wafer having a surface. The system includes: a plurality of fiber laser systems that deliver respective output radiation beams that partially overlap at the wafer surface to form an annealing image; a pre-heat laser system that generates a pre-heat radiation beam that pre-heats a region of the wafer surface to a pre-anneal temperature $T_{PA}$; a wafer support assembly that supports the wafer and that moves the wafer relative to the annealing image so that the annealing image scans over the wafer surface and at least partially within the pre-heat region with a dwell time of $t_D$ in the range 100 ns$\leq t_D \leq$10 ms, or in another example 30 ns$\leq t_D \leq$10 ms, and wherein the annealing image has an amount of optical power $P_A$ in the range 100 W$\leq P_A \leq$10,000 W, or in another example 100 W$\leq P_A \leq$10000 W, so that the wafer surface temperature is raised from the pre-anneal temperature $T_{PA}$ to an annealing temperature $T_A$ during said scanning.

Another aspect of the disclosure is the system described above, wherein the pre-anneal temperature $T_{PA}$ is in the range 200° C.$\leq T_{PA} \leq$600° C.

Another aspect of the disclosure is the system described above, wherein the annealing temperature $T_A$ is either in the range 1100° C.$\leq T_A \leq$1350° C. or in the range $T_A \geq$1410° C.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which:

FIG. 8A is similar to FIG. 2 and illustrates an example embodiment of the LSA system wherein a pre-heat laser system that generates a pre-heat radiation beam is used to pre-heat the wafer surface;

FIGS. 8B and 8C are top-down views of the wafer surface of FIG. 8A showing two examples of the pre-heat region and the annealing image, with FIG. 8B showing the annealing image entirely within the pre-heat region and FIG. 8C showing the annealing image partially within the pre-heat region;

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

Cartesian coordinates are shown in some of the Figures for the sake of reference and are not intended to be limiting as to direction or orientation.

Figure 1:
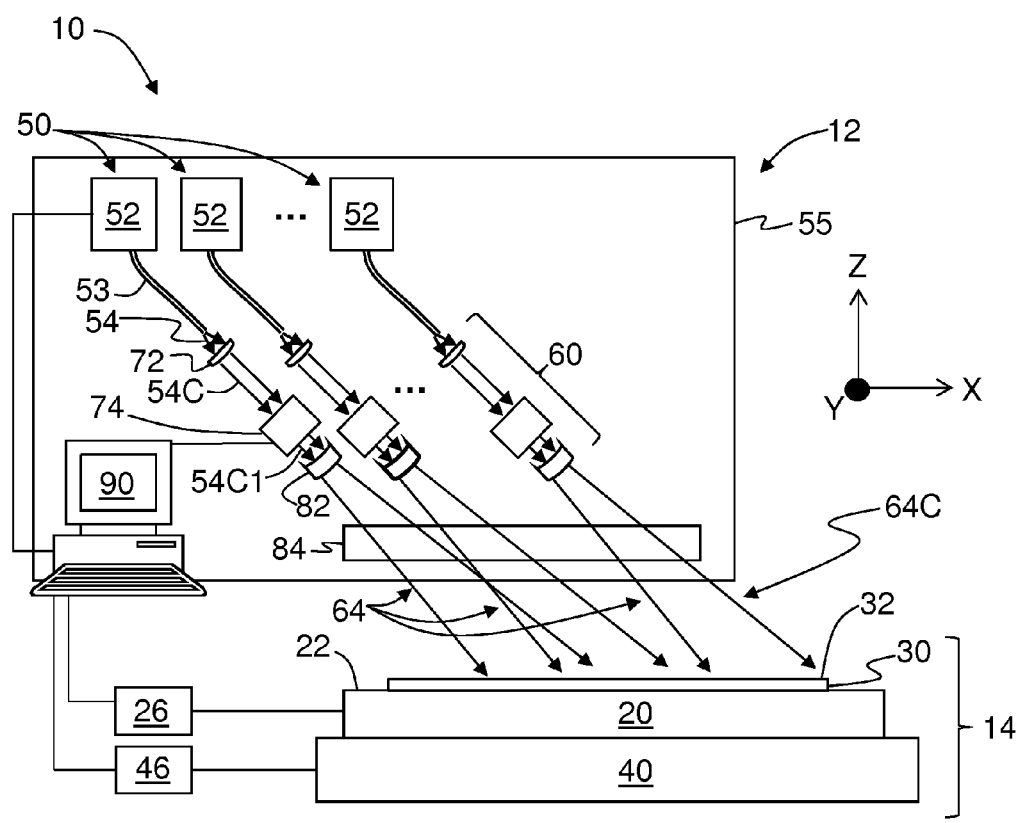
FIG. 1 is a schematic diagram of an example laser spike annealing (LSA) system according to the disclosure and that can be used to carry out the methods disclosed herein.

FIG. 1 is a schematic diagram of an example laser spike annealing (LSA) system 10 according to the disclosure. LSA system 10 includes a laser system 12 and a wafer support assembly 14. Wafer support assembly 14 includes chuck 20 having a surface 22 that supports a semiconductor substrate ("wafer") 30 having a surface 32. In an example, chuck 20 is configured to generate heat to heat wafer 30 up to a pre-anneal temperature $T_{PA}$, e.g., in the range from 200° C. to 600° C. Chuck 20 is shown as connected to a chuck controller 26 that is used to control the chuck temperature.

Chuck 20 resides upon a movable stage 40. The movement of movable stage 40 is controlled by a stage controller 46 that is operably connected to the movable stage.

Figure 2:
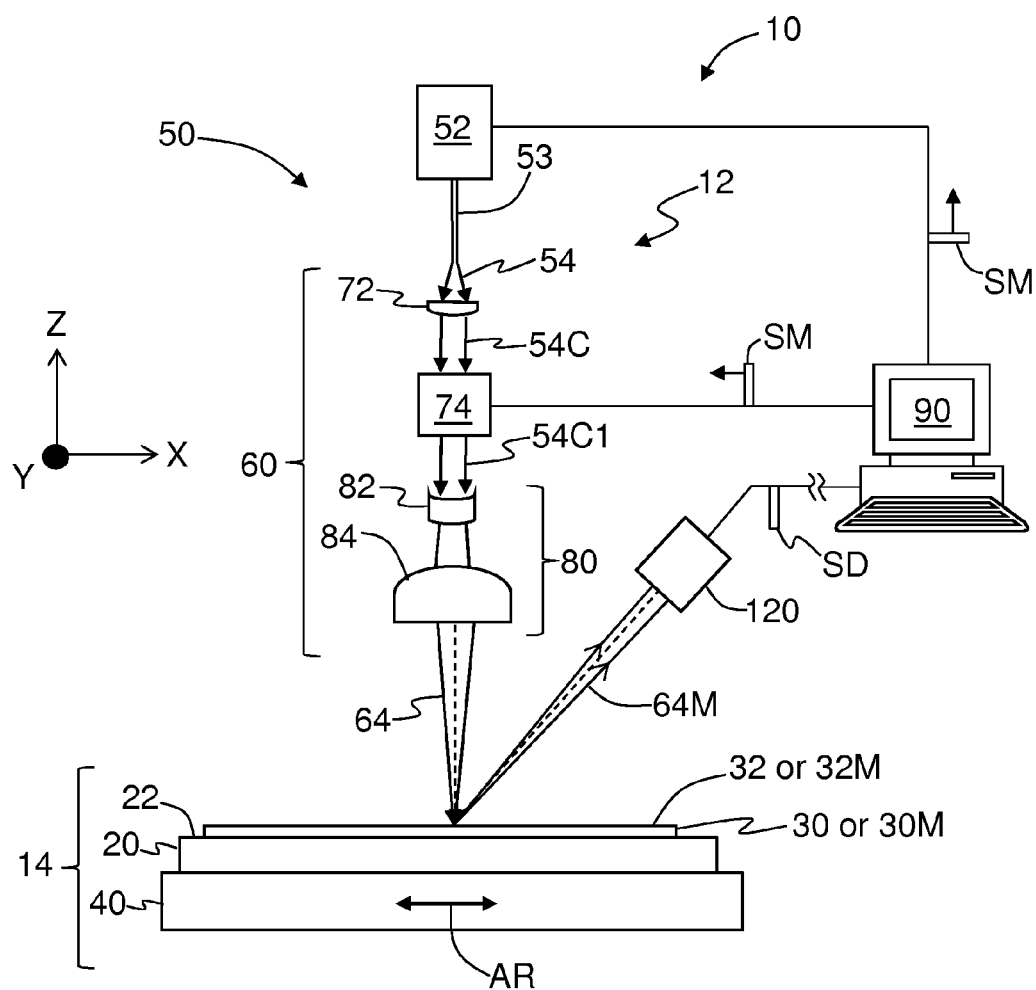
FIG. 2 is a close-up view of an example LSA system showing an example of a fiber laser system.

Laser system 12 includes one or more fiber laser systems 50. FIG. 2 is a close-up view of an example LSA system 10 showing an example of fiber laser system 50. Each fiber laser system 50 includes a fiber laser 52 having a length of fiber 53. In an example, each fiber laser 52 emits initial radiation (initial radiation beam) 54 having a wavelength λ of about 2 μm, e.g., 1.8 μm$\leq$λ$\leq$2.1 μm. An example fiber laser 52 is a Thulium-based fiber laser, such as available from IPG Photonics Corp, Oxford, Mass. In an example, between two and fifty fiber laser systems 50 can be used (i.e., 2, 3, 4 . . . 50 laser systems), and in a more specific example, between three and six fiber laser systems can be used (i.e., 3, 4, 5 or 6 laser systems).

In an example, each fiber laser 52 operates in single mode, i.e., it generates a single-mode initial radiation beam 54. In an example, initial radiation beam 54 has a power of up to about 200 W. In an example embodiment, fiber lasers 52 are configured so that the wavelengths λ of adjacent fiber lasers 52 differ by a few nanometers to avoid speckle effects at wafer surface 32. In the example LSA system 10 of FIG. 1, some or all of fiber laser systems 50 are operably supported by a support member 55, e.g., a mounting plate, operably arranged relative to wafer support assembly 14. In one example, support member 55 is movable relative to wafer support assembly 14, while in another example it is stationary. In an example, the output power of each fiber laser 52 can be directly modulated via a laser controller, which in an example is schematically represented by controller 90 introduced and discussed below.

Each fiber laser system 50 includes an optical system 60 that receives initial radiation beam 54 and generates an output radiation beam 64. The output radiation beams 64 from the plurality of fiber laser systems 50 collectively form a combined output radiation beam 64C, as discussed below. In an example, optical system 60 includes, in order from fiber section 53, a collimating lens 72, a (radiation) modulator 74, and a cylindrical optical system 80 (see FIG. 2) that in an example includes first and second cylindrical lenses 82 and 84 having respective optical powers in orthogonal planes. In an example embodiment illustrated in FIG. 1, second cylindrical lens 84 is formed as a single element that is shared by some or all of the fiber laser systems 50.

Figure 4A:
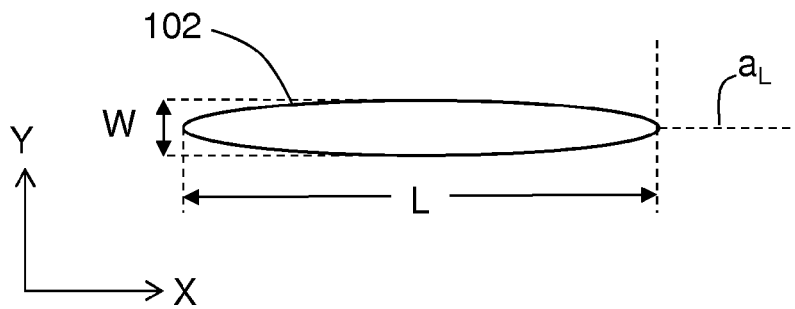
FIG. 4A is a close-up view of an example elongate image formed by the output radiation beam intersecting the surface of the wafer.

Cylindrical optical system 80 serves to take a generally symmetric Gaussian collimated radiation beam 54C from collimating lens 72 and expand it in one direction and then bring it to a focus in the orthogonal direction so that the resulting output radiation beam 64 forms an elongate image 102 on wafer surface 32 (see FIG. 4A). Elongate image 102 has a long axis $a_L$. In an example, some or all of the elements that make up optical system 60 are formed from fused silica.

The LSA system 10 also includes a controller 90 that in an example embodiment is operably connected to wafer support assembly 14, and in particular to chuck controller 26 and stage controller 46 to control the heating of chuck 20 and the scanning movement of movable stage 40 as discussed below. In an example, controller 90 is also connected to laser system 12, and in particular to fiber laser systems 50 to control the activation of fiber lasers 52 and to control the amount of power in initial radiation beam 54, as discussed below. An example controller 90 comprises a computer. Controller 90 is generally programmable with instructions embodied in a computer-readable medium that cause the controller to control the operation of LSA system 10. Controller 90 can comprise or otherwise include one or more computers, processors, microcontrollers, microcomputers, programmable logic controllers, application-specific integrated circuits and other programmable circuits.

In an example of the operation of LSA system 10, controller 90 causes fiber lasers 52 to emit initial radiation beam 54, which travels through fiber section 53 and emerges from the fiber section as a divergent beam. The divergent initial radiation beam 54 is received by collimating lens 72, which serves to form the aforementioned collimated radiation beam 54C. Collimated radiation beam 54C is then received by modulator 74. As mentioned above, controller 90 can be used to modulate the output power of fiber lasers 52.

Figure 3:
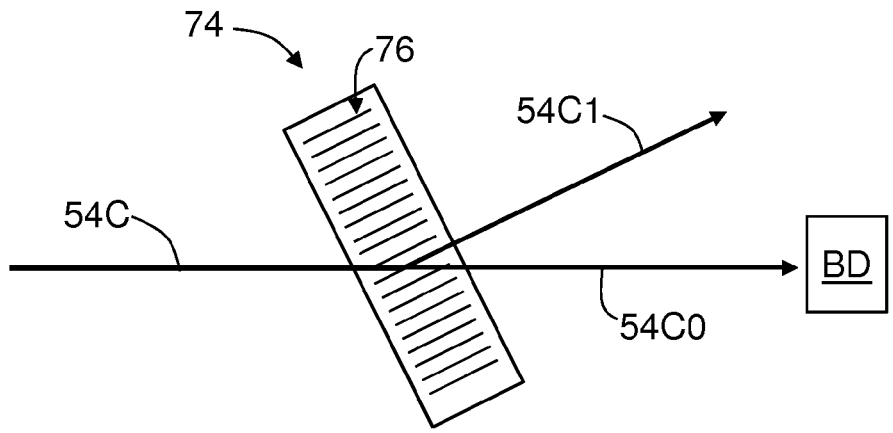
FIG. 3 is a close-up view of an example modulator in the form of an acousto-optic modulator, which forms a standing acoustic-wave grating.

FIG. 3 is a close-up view of an example modulator 74 in the form of an acousto-optic modulator, which forms a standing acoustic-wave grating ("grating") 76. The grating 76 serves to diffract collimated radiation beam 54C into a $0^{th}$-order radiation beam 54C0 and a $1^{st}$-order radiation beam 54C1. By adjusting the amplitude of the acoustic-wave grating 76, the amount of power in the $0^{th}$-order and $1^{st}$-order radiation beams can be adjusted. In an example, the $1^{st}$-order radiation beam 54C1 continues to cylindrical optical system 80 while the $0^{th}$-order radiation beam 54C0 is directed to a beam dump BD. The modulator 74 can be driven at high frequencies (e.g., in the MHz range) that are significantly shorter than the thermal diffusion time of silicon. This allows for using modulator 74 to control the power in each output radiation beam 64 to compensate for any temperature gradients that occur in wafer surface 32.

In an example embodiment, modulator 74 is not employed and fiber laser 52 is modulated directly, e.g., via a laser controller, which as noted above can be controller 90. This direct modulation approach of the fiber lasers 52 can be used especially when the velocity of stage 40 is slow enough to allow for modulation to be performed using feedback via the laser controller.

In an example embodiment of the operation of LSA system 10 as illustrated in FIG. 2, the wafer 30 to be processed is replaced by a measurement wafer 30M that is used to calibrate the power output of each fiber laser system 50. To perform the calibration, each fiber laser system 50 is activated to generate its corresponding output radiation beam 64. Measurement wafer 30M has a surface 32M configured to direct a select amount of output radiation beam 64 as measurement radiation 64M to a photodetector 120 arrange relative to measurement wafer 30M.

For example, surface 32M of measurement wafer 30M may have a select amount of surface roughness designed to cause a select or otherwise known amount of scattering of output radiation beam 64 when forming measurement radiation 64M. The calibration power measurements for the fiber laser systems 50 as performed by photodetector 120 are embodied in photodetector signals SD provided to controller 90. Controller 90 processes the photodetector signals SD and adjusts the respective modulators 74 accordingly (e.g., via a modulator control signal SM) so that each output radiation beam 64 delivers substantially the same amount of optical power or a select amount of power to wafer surface 32 of wafer 30 to be processed. In another example, the modulator control signal SM is directed to fiber lasers 52 so that the controller 90 acts a laser controller that controls the output power of each fiber laser.

In an example, photodetector 120 comprises a multichannel pyrometer that can be used during the normal operation of LSA system 10 to control the power distribution in the combined output radiation beam 64C, as described below.

The $1^{st}$-order radiation beam 54C1 is received by cylindrical optical system 80, which as discussed above forms output radiation beam 64 that has an elongate direction and focused, narrower direction. The output radiation beams 64 from the fiber laser systems 50 are directed to wafer surface 32 in a manner that results in the formation of respective elongate images 102, wherein adjacent elongate images partially overlap.

Figure 4B:
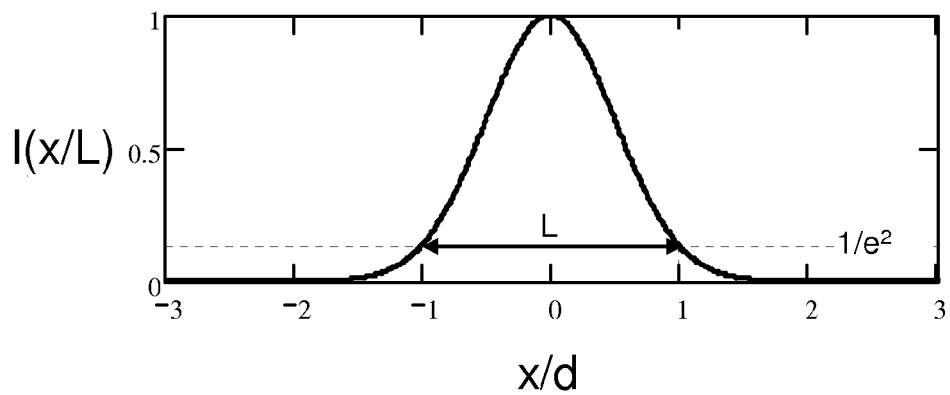
FIG. 4B is a plot of the intensity I (normalized units) as a function of position coordinate x/L for an example elongate image formed by a Gaussian intensity output radiation beam.

FIG. 4A is a close-up view of an example elongate image 102 formed by output radiation beam 64 intersecting the surface 32 of wafer 30. Elongate image 102 has a width W in the narrow direction (Y-direction) and a length L in the elongate direction (X-direction) that defines long axis $a_L$. In an example, with width W and length L are defined by a threshold intensity contour of a Gaussian intensity distribution that defines elongate image 102. FIG. 4B is a plot of the intensity I (normalized units) as a function of position coordinate x/L for an example elongate image formed by a Gaussian intensity output radiation beam 64 whose profile can be described by the equation $$I(x) = \exp\{-2 \cdot (x/L)^2\},$$

In an example, the length L is defined by the $1/e^2$ intensity contour, as shown in FIG. 4B.

Figure 5:
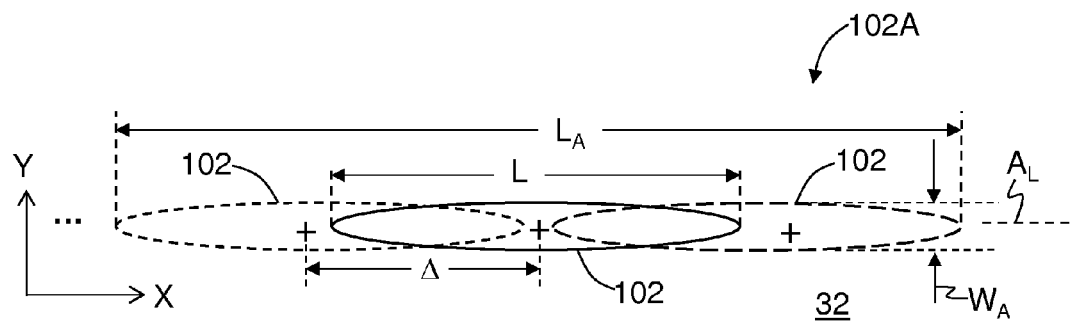
FIG. 5 is a top-down view of a wafer surface illustrating how multiple elongate images can be partially overlapped in the long direction (X-direction) to form a combined image referred to herein as an "annealing image"

FIG. 5 is a top-down view of wafer surface 32 illustrating how multiple elongate images 102 can be partially overlapped in the long direction (X-direction) to form a combined image, referred to as annealing image 102A. Annealing image 102A has a long axis $A_L$, a length $L_A$ (referred to as the "annealing length") measured in the direction of the long axis, and a width $W_A$ measured in the direction perpendicular to the long axis. The offset in the long direction between adjacent images is denoted A. The intensity profile $I_A(x)$ of annealing image 102A can be expressed as:

$$I_A(x) = \Sigma \exp\{-2 \cdot [(x - \Delta \cdot n)/L]^2\},$$

where n is a number parameter relating to the (integer) number of combined elongate images, and the offset $\Delta$ is measured relative to the center of the annealing image. Annealing image has an overall length $L_A$, which in an example is defined by the $1/e^2$ intensity contour of annealing image 102A. An example range on the length $L_A$ is given by 3 mm≤$L_A$≤30 mm. An example range on the width $W_A$ is 50 microns≤$W_A$≤500 microns or in another example 25 microns≤$W_A$≤500.

Figure 6A:
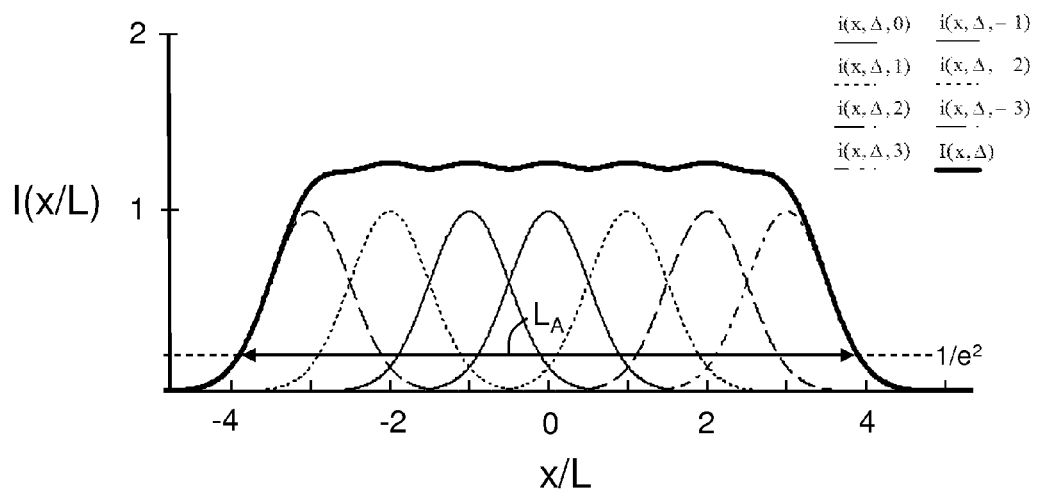
FIG. 6A is a plot of the intensity profile $I_A(x/L)$ of an annealing formed by combining seven elongate images using an offset $\Delta$=L/2.

FIG. 6A is a plot of the intensity profile $I_A(x/L)$ of annealing image 102A formed by combining seven elongate images 102. The number parameter n ranges from −3 to +3 in the above expression for $I_A(x)$, and the offset $\Delta = L/2$.

Figure 6B:
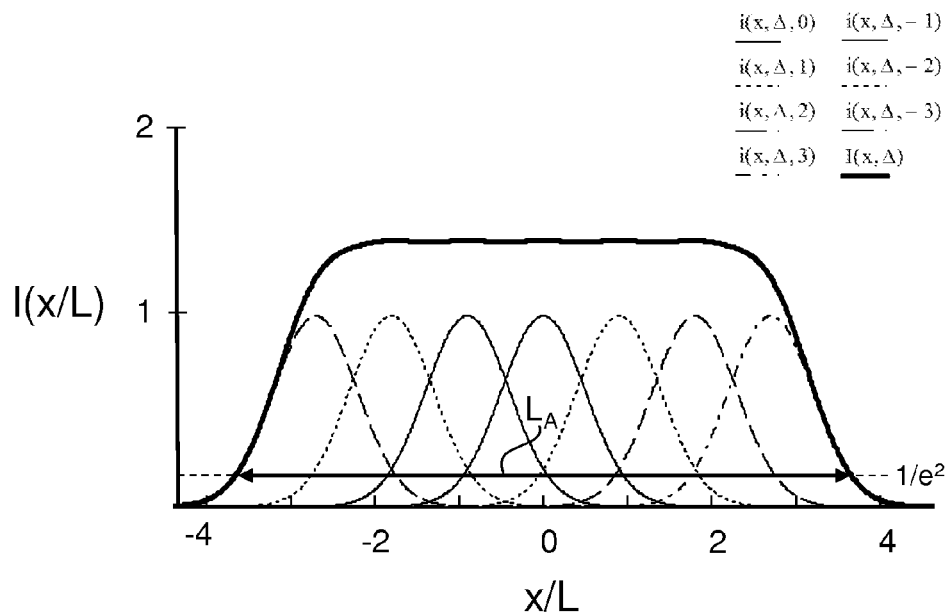
FIGS. 6B and 6C are similar to FIG. 6A but for respective offsets $\Delta$=0.9·(L/2) and $\Delta$=0.79·(L/2)
Figure 6C:
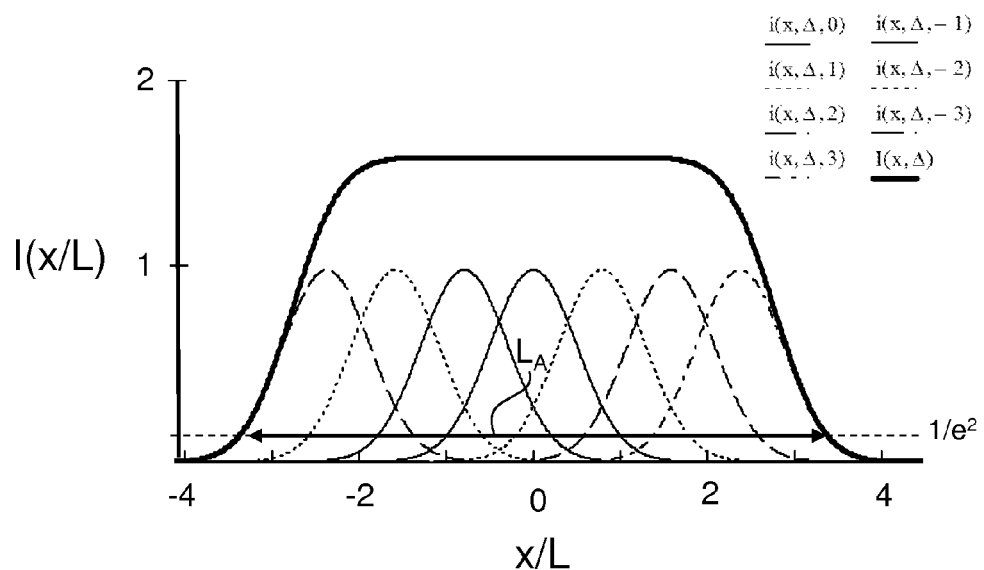

FIGS. 6B and 6C are similar to FIG. 6A but for $\Delta = 0.9 \cdot (L/2)$ and $\Delta = 0.79 \cdot (L/2)$. As the value of the offset $\Delta$ gets smaller, the overall intensity of annealing image 102A increases and its overall length $L_A$ decreases.

In an example embodiment, annealing image 102A has an amount of optical power $P_A$ in the range from 100 W≤$P_A$≤10,000 W or in another example, 100 W≤$P_A$≤1000 W.

In an example, the uniformity of annealing image 102A is judged by thermal emission E from wafer 30, which is very sensitive to the variation of the temperature, which in turn is proportional to the power density: $\delta(E)/E \approx (10^{-\alpha}) \cdot \delta(T)/T$, where 11<α<15. An acceptable uniformity of the intensity profile is therefore given by substantially uniform distribution in the flat portion of the intensity profile. Usually, the existence of visible modulations in intensity leads to unacceptable variations of the temperature of wafer 30. Of the intensity profiles $I_A(x)$ of annealing image 102A shown in FIGS. 6A through 6C, the intensity profile of FIG. 6C has acceptable uniformity while those of FIGS. 6A and 6B do not for most annealing applications. Thus, in an example, the offset $\alpha \leq 0.79 \cdot (L/2)$ is used to obtain a suitably uniform intensity profile and thus substantially uniform wafer heating.

Once annealing image 102A is formed, it is scanned over wafer surface 32 to perform laser spike annealing of the wafer surface, e.g., to enhance dopant diffusion in semiconductor devices (not shown) supported by wafer 30. The scanning of annealing image 102A is accomplished in one example embodiment by controller 90 directing the stage controller 46 to move the movable stage 40 so that wafer surface 32 moves relative to annealing image 102A. The movement of wafer 30 is performed such that the dwell time $t_D$ of the annealing image 102A at a given point on the wafer surface 32 that is scanned is in the range 30 ns≤$t_D$≤10 ms or in another example 100 ns≤$t_D$≤10 ms.

Figure 7A:
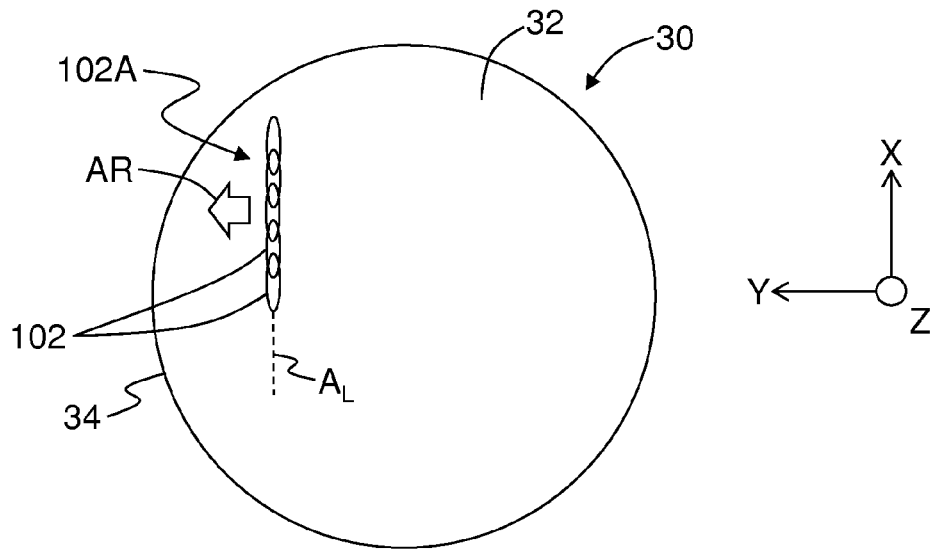
FIG. 7A is a top-down view of a wafer that shows an example annealing image as made up of individual elongate images that overlap in the long direction, where the annealing image is scanned relative to the wafer surface in the direction indicated by arrow AR.

FIG. 7A is a top-down view of wafer 30 and wafer surface 32, along with a wafer edge 34, and shows annealing image 102A as made up of individual elongate images 102 that overlap in the long direction. FIG. 7A also shows the direction of movement of the annealing image 102A relative to wafer surface 32, as indicated by arrow AR. Annealing image 102A moves (scans) in a direction perpendicular to its long axis $A_L$, i.e., moves in the Y-direction when its long axis is in the X-direction, as shown in FIG. 7A.

Figure 7B:
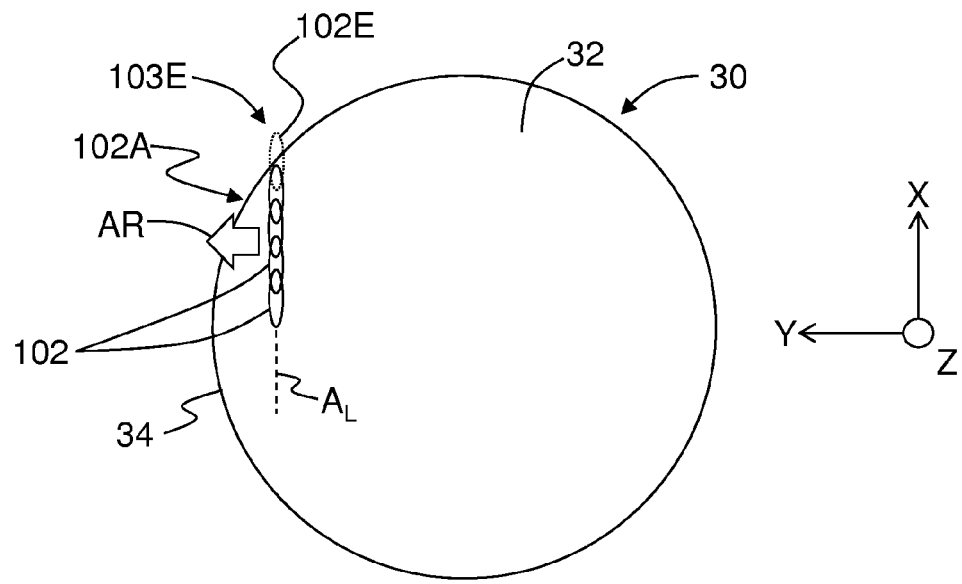
FIG. 7B is similar to FIG. 7A, but wherein the annealing image crosses a portion of the edge of the wafer and the endmost elongate image is turned off or reduced in intensity to avoid causing edge damage to the wafer.
Figure 7C:
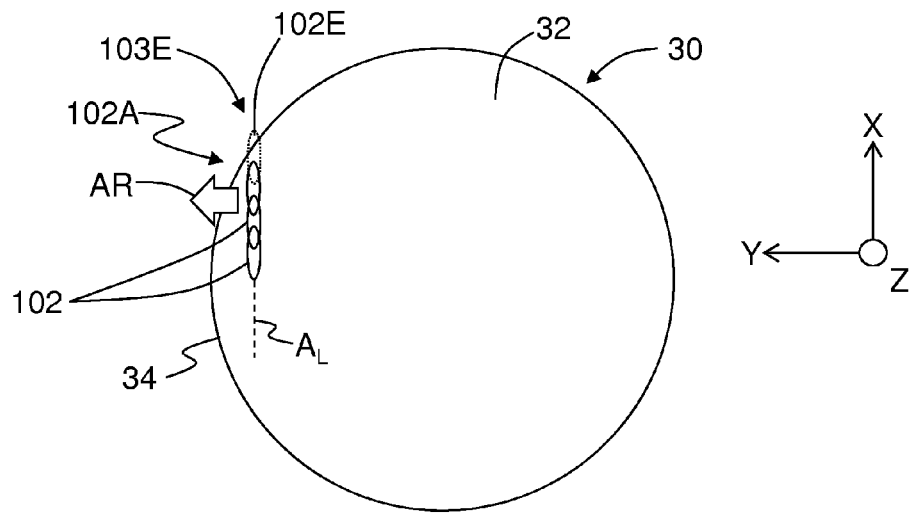
FIGS. 7C and 7D are similar to FIG. 7B, and show the annealing image continuing to cross the wafer edge while the endmost elongate image is turned off or reduced in intensity, which reduces the size of the annealing image as it is scanned over the wafer edge.
Figure 7D:
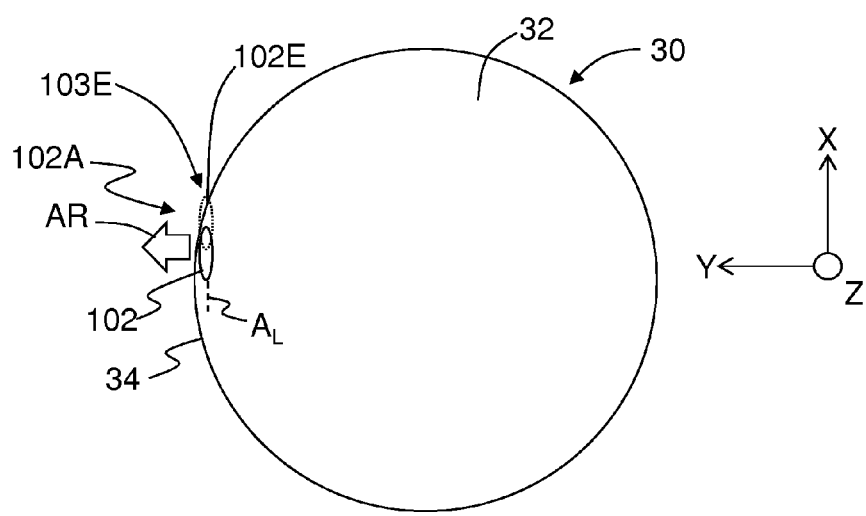

An advantage of forming annealing image 102A from multiple elongate images 102 is that the annealing image can be tailored or otherwise adjusted by changing the individual elongate images. This adjustment can be performed even during scanning of annealing image 102A. FIG. 7B is similar to FIG. 7A and illustrates an example where one end 103E of annealing image 102A crosses over wafer edge 34. To avoid causing damage to wafer edge 34 from the power in annealing image 102A, the endmost elongate image 102 (denoted 102E) is turned off or is reduced in power or intensity so that the annealing image does not irradiate the wafer edge (or does not irradiate the wafer edge with substantial power or intensity). This process of turning off or reducing the power or intensity in the endmost elongate image 102E can continue, as illustrated in FIGS. 7C and 7D as annealing beam 102A continues over its scan path and continues to cross over wafer edge 34. Ultimately, there is only one elongate image 102 left that makes up annealing image 102A.

FIG. 8A is similar to FIG. 2 and illustrates an example embodiment of LSA system 10 wherein a pre-heat laser system 200 that generates a pre-heat radiation beam 202 is used to pre-heat wafer surface 32. As illustrated in the close-up view of FIG. 8B, pre-heat laser beam 202 serves to create a pre-heated region 202R on wafer surface 32, which serves to increase the absorption of output radiation beam 64 at the wafer surface. In an example, the pre-heat (pre-anneal) temperature $T_{PA}$ of pre-heated region 202R is in the range from 200° C. to 600° C. Annealing image 102A, which resides at least partially within pre-heat region 202R, then brings the wafer surface temperature up from the pre-anneal temperature $T_{PA}$ to an annealing temperature $T_A$, which in an example is in the range from 1100 to 1350° C. for a non-melt annealing process and is greater than the melting temperature of doped silicon (e.g., about 1410° C.) for a melt annealing process.

In the example of FIG. 8B, pre-heated region 202R moves along with annealing image 102A, as indicated by arrows AR1 and AR2. Examples of performing laser annealing using a pre-heat laser beam 202 are disclosed in U.S. Pre-Grant Publication No. US2012/0111838 (the '838 publication). FIG. 8C shows an example similar to FIG. 8B but wherein the edges 103E of anneal image 102A lie outside pre-heated region 202R. The arrangement of FIG. 8C provides a way of avoiding annealing with intensity non-uniformities or gradual intensity drop-offs that might arise at or near edges 103E of annealing image 102A.

Figure 9A:
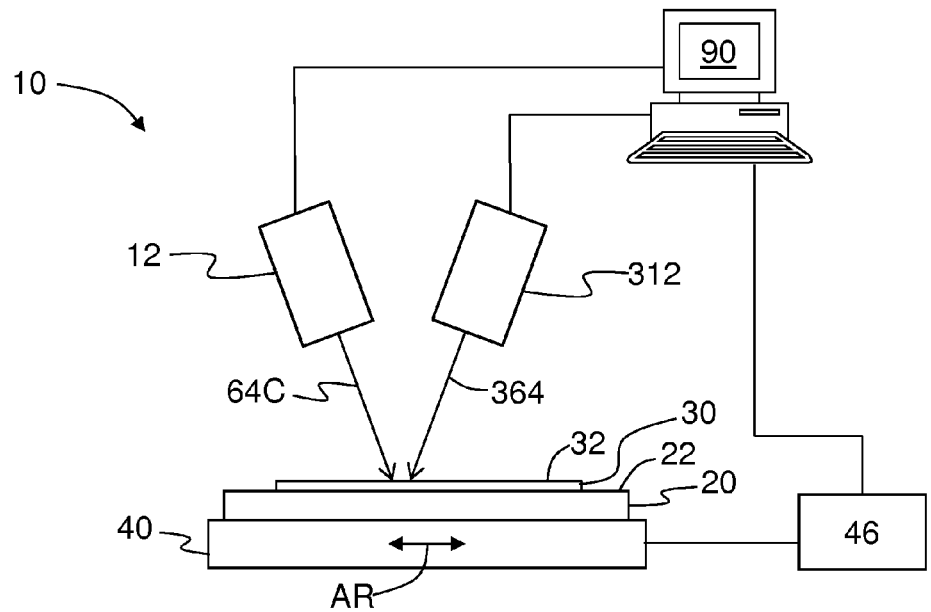
FIG. 9A is a schematic diagram that illustrates an example LSA system wherein the laser system made up of fiber laser systems forms a pre-annealing image used to pre-heat wafer surface to form the pre-heated region, and a second laser system is used to form the annealing image.
Figure 9B:
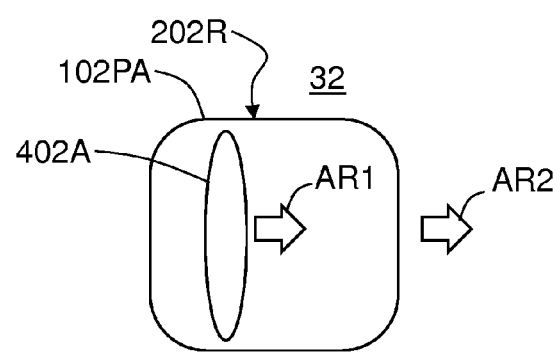
FIG. 9B is similar to FIG. 8B and shows the pre-heat region formed by the pre-annealing image, along with the annealing image formed by the second laser system of the example LSA system of FIG. 9A.

An aspect of the disclosure is the use of annealing image 102A to pre-heat wafer surface 32 and to perform LSA using another annealing beam in a manner similar to that shown in FIGS. 8A and 8B and as described in the '838 publication. FIG. 9A is a schematic diagram that illustrates an example LSA system 10 that includes laser system 12 that forms annealing image 102A, which is now used to pre-heat wafer surface 32 to form pre-heated region 202R. In this capacity, annealing image 102A is referred to as pre-annealing image 102PA. LSA system 10 of FIG. 9A also includes a second laser system 312 that generates an annealing laser beam 364 that forms an annealing image 402A on wafer surface 32, as shown in the tow-down close-up view of FIG. 9B. Annealing laser beam 364 can be a continuous-wave (CW) laser beam or a pulsed laser beam.

Annealing laser beam 364, which resides at least partially within pre-heat region 202R, serves to bring the wafer surface 32 from the pre-anneal temperature $T_{PA}$ up to an annealing temperature $T_A$, which in an example is in the range from 1100° C. to 1350° C. (i.e., 1100° C.≤$T_A$≤1350° C.) for a non-melt annealing process and is greater than the melting temperature of doped silicon (e.g., about 1410° C.) for a melt annealing process. In another example, 1100° C.≤$T_A$≤1300° C.

The various embodiments of LSA system 10 disclosed herein have a number of advantages. One advantage is that fiber lasers 52 are tunable so that the wavelength λ of adjacent fiber lasers can be detuned from one another by a few nanometers. This property can be used to make their initial output beams 54 substantially incoherent relative to one another to avoid adverse coherent-light effects, such as speckle that forms from reflection from wafer surface 32. Another advantage is that fiber lasers 52 have high reliability, high efficiency, low cost and take up less room than other types of lasers. Also, because fiber lasers operate in single mode, the output beam 54 has a relatively clean Gaussian profile and so can be processed using a simple optical system 60. This in turn allows for a reasonably high optical system throughput, e.g., about 70%. Consequently, a 200 W initial radiation beam 54 can result in an output radiation beam 64 that delivers 140 W to wafer surface 32.

In addition, the output wavelength λ of nominally (i.e., about) 2 μm is substantially larger than the size of features on wafer surface 32, so that adverse wafer pattern effects that can cause heating uniformity are mitigated. Also, the 2 μm output wavelength λ of the fiber lasers 52 and the tunability of this output wavelength allows for LSA system 10 to be tuned to avoid select absorption bands of process gasses that may reside adjacent wafer surface 32. For example, ammonia has a strong absorption band right around 2 μm, and the fiber laser wavelength λ can be tuned slightly away from this absorption band wavelength.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A method of performing laser spike annealing of a surface of a wafer, comprising:
    generating with a plurality of fiber laser systems respective continuous-wave (CW) output radiation beams that partially overlap at the wafer surface to form an elongate annealing image having a long axis and a length $L_A$ along the long axis, the annealing image having an amount of optical power PA in the range 100 W≤$P_A$≤10,000 W;
    heating at least a region of the wafer to a pre-anneal temperature $T_{PA}$ to define a pre-heat region; and
    scanning the elongate annealing image over the wafer surface and at least partially within the pre-heat region in a direction substantially perpendicular to the long axis so that the annealing image has a dwell time $t_D$ in the range 30 ns≤$t_D$≤10 ms and raises the wafer surface temperature to an annealing temperature $T_A$.

2. The method according to claim 1, wherein the length $L_A$ is in the range 3 mm≤$L_A$≤450 mm.

3. The method according to claim 1, wherein the annealing image has width $W_A$ measured perpendicular to the long axis, and wherein 25 microns≤$W_A$≤500 microns.

4. The method according to claim 1, wherein the annealing image has an amount of optical power PA in the range 100 W≤$P_A$≤1,000 W.

5. The method according to claim 1, wherein the pre-anneal temperature $T_{PA}$ is in the range 200° C.≤$T_{PA}$≤600° C.

6. The method of claim 5, wherein the anneal temperature $T_A$ is either in the range 1100° C.≤$T_A$≤1350° C. or in the range $T_A$≥1410° C.

7. The method of performing laser spike annealing according to claim 1, further comprising:
    measuring a temperature distribution at the wafer surface; and
    adjusting an amount of power in at least one of the CW output radiation beams to improve an amount of uniformity in the temperature distribution.

8. The method of performing laser spike annealing according to claim 1, wherein the wafer has an edge, the annealing image has an end, and further comprising either reducing an amount of power in or turning off the CW output radiation beam that forms the end of the annealing image prior to the annealing image passing over the wafer edge.

9. The method of claim 1, wherein the annealing image is formed by between three and fifty CW output radiation beams.

10. The method of claim 1, wherein the CW output radiation beams define elongate images of length L that partially overlap along the long axis by an amount A, and wherein the amount of overlap A≥0.79·(L/2).

11. A method of optimizing an amount of uniformity of an annealing image using a measurement wafer having a surface, comprising:
    generating with a plurality of fiber laser systems respective continuous-wave (CW) output radiation beams that partially overlap at the surface of the measurement wafer to form an elongate annealing image having a long axis and a length $L_A$ along the long axis, the annealing image having an amount of optical power PA in the range 100 W≤$P_A$≤10,000 W;
    detecting an amount of optical power reflected from the measurement wafer for each of the elongate radiation beams; and
    adjusting an amount of optical power in one or more of the elongate radiation beams to optimize an amount of uniformity of the annealing image.

12. A method of performing laser spike annealing of a surface of a wafer, comprising:
    generating with a plurality of fiber laser systems respective continuous-wave (CW) output radiation beams that partially overlap at the wafer surface to form an elongate pre-annealing image having a long axis and a length $L_A$ along the long axis, the annealing image having an amount of optical power PA in the range 100 W≤$P_A$≤10,000 W;
    heating at least a region of the wafer with the elongate pre-annealing image to a pre-anneal temperature $T_{PA}$ to define a pre-heat region; and
    scanning a second laser beam that resides at least partially within the pre-heat region to raise the wafer surface temperature to an annealing temperature $T_A$.

13. The method according to claim 12, wherein the annealing temperature $T_A$ is in the range 1100° C.≤$T_A$≤1350° C.

14. The method according to claim 12, wherein the annealing temperature $T_A$ is greater than the melt temperature of doped silicon.

* * * * *